(12) United States Patent
Matsuura et al.

(10) Patent No.: US 10,645,809 B2
(45) Date of Patent: May 5, 2020

(54) SURFACE-TREATED COPPER FOIL, METHOD FOR PRODUCING SAME, COPPER-CLAD LAMINATE FOR PRINTED WIRING BOARD, AND PRINTED WIRING BOARD

(71) Applicant: Mitsui Mining & Smelting Co., Ltd., Tokyo (JP)

(72) Inventors: Yoshinori Matsuura, Ageo (JP); Joe Nishikawa, Ageo (JP); Hiroaki Kurihara, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

(21) Appl. No.: 15/305,572

(22) PCT Filed: Sep. 3, 2015

(86) PCT No.: PCT/JP2015/075080
§ 371 (c)(1),
(2) Date: Oct. 20, 2016

(87) PCT Pub. No.: WO2016/043058
PCT Pub. Date: Mar. 24, 2016

(65) Prior Publication Data
US 2017/0188457 A1    Jun. 29, 2017

(30) Foreign Application Priority Data

Sep. 19, 2014   (JP) .................................. 2014-191240

(51) Int. Cl.
*B32B 15/08*  (2006.01)
*H05K 3/02*  (2006.01)
(Continued)

(52) U.S. Cl.
CPC ............... *H05K 1/09* (2013.01); *B32B 15/01* (2013.01); *B32B 15/08* (2013.01); *B32B 15/20* (2013.01);
(Continued)

(58) Field of Classification Search
CPC ......... H01L 21/76801; H01L 21/76832; H01L 23/53238; H01L 21/76808; H01L 21/76829
See application file for complete search history.

(56) References Cited

U.S. PATENT DOCUMENTS 5,403,620 A * 4/1995 Kaesz ..................... C23C 16/18
427/123
5,592,004 A * 1/1997 Tamura ................. C23C 16/347
257/316
(Continued)

FOREIGN PATENT DOCUMENTS

CN   102812786 A   12/2012
JP   H05-279840 A   10/1993
(Continued)

OTHER PUBLICATIONS

Translation—JP-2010149294-A ; Jul. 2010; Yatsuka, Tsuyoshi.*
(Continued)

*Primary Examiner* — Humera N Sheikh
*Assistant Examiner* — Elizabeth D Ivey
(74) *Attorney, Agent, or Firm* — Harness, Dickey & Pierce, P.L.C.

(57) ABSTRACT

There is provided a surface-treated copper foil including a surface coating layer provided on at least one surface of a copper foil, the surface coating layer being mainly composed of silicon with a hydrogen content of 1 to 35 atomic % and/or a carbon content of 1 to 15 atomic %. This foil can be manufactured by forming a surface coating layer com-
(Continued)

posed mainly of silicon with the above hydrogen and carbon contents on at least one surface of the copper foil by PVD or CVD. The present invention can provide a copper foil with a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

12 Claims, 6 Drawing Sheets

(51) Int. Cl.

| | | |
|---|---|---|
| C23C 14/00 | (2006.01) | |
| B32B 15/20 | (2006.01) | |
| C23C 14/06 | (2006.01) | |
| C23C 14/16 | (2006.01) | |
| C23C 14/34 | (2006.01) | |
| H05K 1/03 | (2006.01) | |
| H05K 3/28 | (2006.01) | |
| H05K 1/09 | (2006.01) | |
| H05K 3/38 | (2006.01) | |
| C23C 14/20 | (2006.01) | |
| B32B 27/34 | (2006.01) | |
| B32B 27/36 | (2006.01) | |
| B32B 15/01 | (2006.01) | |
| C23C 16/24 | (2006.01) | |

(52) U.S. Cl.
CPC .............. *B32B 27/34* (2013.01); *B32B 27/36* (2013.01); *C23C 14/0005* (2013.01); *C23C 14/0036* (2013.01); *C23C 14/0605* (2013.01); *C23C 14/0635* (2013.01); *C23C 14/165* (2013.01); *C23C 14/205* (2013.01); *C23C 14/3464* (2013.01); *C23C 16/24* (2013.01); *H05K 1/036* (2013.01); *H05K 3/022* (2013.01); *H05K 3/28* (2013.01); *H05K 3/388* (2013.01); *B32B 2255/06* (2013.01); *B32B 2255/205* (2013.01); *H05K 2201/0175* (2013.01); *H05K 2201/0355* (2013.01)

(56) References Cited

U.S. PATENT DOCUMENTS

| | | | | |
|---|---|---|---|---|
| 2001/0026896 | A1* | 10/2001 | Nishikawa | G02B 5/201 430/7 |
| 2002/0171122 | A1* | 11/2002 | Voutsas | C23C 14/165 257/588 |
| 2008/0044664 | A1* | 2/2008 | Shirato | C08G 73/22 428/426 |
| 2010/0129604 | A1* | 5/2010 | Uchida | B32B 15/08 428/141 |
| 2011/0146787 | A1* | 6/2011 | Allen | C09D 5/32 136/256 |
| 2011/0244141 | A1* | 10/2011 | Heller | C23C 16/045 427/535 |
| 2013/0000954 | A1* | 1/2013 | Hashimoto | G06F 3/044 174/250 |
| 2014/0227548 | A1* | 8/2014 | Myrick | C06B 45/30 428/570 |

FOREIGN PATENT DOCUMENTS

| | | | |
|---|---|---|---|
| JP | H05-279870 A | | 10/1993 |
| JP | 2005-219258 A | | 8/2005 |
| JP | 2007-030326 A | | 2/2007 |
| JP | 2007-098732 A | | 4/2007 |
| JP | 2008-311328 A | | 12/2008 |
| JP | 2010-018855 A | | 1/2010 |
| JP | 2010-149294 A | | 7/2010 |
| JP | 2010149294 A | * | 7/2010 |
| JP | 2010-201620 A | | 9/2010 |

OTHER PUBLICATIONS

Office Action from Korean Patent Office regarding Korean Patent Application No. 10-2016-7023996, pp. 1-7, dated Oct. 17, 2016.
Korean Appeal Decision regarding KR Application No. 10-2016-7023996, dated Jun. 30, 2017 (11 pages).
International Search Report for PCT/JP2015/075080, dated Nov. 17, 2015; ISA/JP.
Written Opinion of PCT/JP2015/075080, dated Nov. 17, 2015; ISA/JP.
Chinese Office Action for Chinese Application No. 201580016727.1 dated Mar. 7, 2017.
Chinese Office Action for Patent Application No. CN 201580016727.1 dated Aug. 15, 2017.

* cited by examiner

SURFACE-TREATED COPPER FOIL, METHOD FOR PRODUCING SAME, COPPER-CLAD LAMINATE FOR PRINTED WIRING BOARD, AND PRINTED WIRING BOARD

CROSS-REFERENCE TO RELATED APPLICATIONS

This application is a U.S. National Stage Application of International Application No. PCT/JP2015/075080, filed on Sep. 3, 2015, and published in Japanese as WO 2016/043058 A1 on Mar. 24, 2016. This application claims priority to Japanese Application No. 2014-191240, filed on Sep. 19, 2014. The entire disclosures of the above applications are incorporated herein by reference.

TECHNICAL FIELD

The present invention relates to a surface-treated copper foil, a method for manufacturing the surface-treated copper foil, a copper-clad laminate for a printed wiring board, and a printed wiring board.

BACKGROUND ART

In recent years, downsizing and sophistication of electronic devices, such as portable electronic devices, demand printed wiring boards having further miniaturized (fine-pitched) wiring patterns. To meet such a requirement, a copper foil for manufacturing a printed wiring board is desired to have a smaller thickness and a lower surface roughness than current ones.

The copper foil for manufacturing a printed wiring board is used in lamination to an insulating resin substrate. It is important to ensure bonding strength between the copper foil and the insulating resin substrate because low bonding strength may cause traces to separate during manufacturing the printed wiring board, resulting in a low product yield. In this regard, usual copper foil for manufacturing printed wiring boards is subjected to a roughening treatment to form asperities on the surface to be bonded. The asperities are pressed to bite into the insulating resin substrate to exhibit an anchoring effect, resulting in improved adhesion. This technique involving the roughening treatment is, however, incompatible with the above-described copper foil aimed to meet the fine pitch and having a smaller thickness and a lower surface roughness than conventional ones.

A copper foil for a printed wiring board to improve the adhesion between the copper foil and the insulating resin substrate without roughening treatment is known. For example, JP2010-18855A discloses a surface-treated copper foil having a surface coating layer on a bonding surface thereof to be laminated to an insulating resin substrate used for manufacturing a copper-clad laminate, the surface-coating layer being formed by dry deposition of a metal component having a high melting point of 1400° C. or higher and a carbon component on the cleaned bonding surface of the copper foil.

SUMMARY OF INVENTION

The present inventors have currently found that forming a silicon-based surface coating layer incorporated with hydrogen and/or carbon at a predetermined content on at least one surface of a copper foil can provide a copper foil having a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

Accordingly, it is an object of the present invention to provide a copper foil having a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

According to a first aspect of the present invention, there is provided a surface-treated copper foil including a copper foil and a surface coating layer provided on at least one surface of the copper foil, the surface coating layer being mainly composed of silicon, and having a hydrogen content of 1 to 35 atomic % and/or a carbon content of 1 to 15 atomic %.

According to a second aspect of the present invention, there is provided a copper-clad laminate for a printed wiring board provided with the surface-treated copper foil according to the first aspect and a resin layer provided in close contact with the surface coating layer.

According to a third aspect of the present invention, there is provided a printed wiring board including a laminated layer structure including, in sequence, a resin layer, a layer mainly composed of (or comprising) silicon, having a hydrogen content of 1 to 35 atomic % and/or a carbon content of 1 to 15 atomic %, and a copper layer.

According to a fourth aspect of the present invention, there is provided a method for manufacturing a surface-treated copper foil according to the above aspects, including the steps of providing a copper foil and forming a surface coating layer, which is mainly composed of (or comprising) silicon and has a hydrogen content of 1 to 35 atomic % and/or a carbon content of 1 to 15 atomic %, on at least one surface of the copper foil by physical or chemical vapor deposition.

DESCRIPTION OF EMBODIMENT

Surface-Treated Copper Foil

A surface-treated copper foil according to the present invention includes a copper foil and a surface coating layer provided on at least one surface of the copper foil. Optionally, the surface coating layer can be provided on both surfaces of the copper foil. The surface coating layer is mainly composed of silicon having a hydrogen content of 1 to 35 atomic % and/or a carbon content of 1 to 15 atomic %. The resulting silicon-based surface coating layer containing hydrogen and/or carbon at predetermined contents can provide a copper foil provided with a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

In particular, for the formation of a highly miniaturized wiring pattern having such a fine line/space (L/S) of (13 μm or less)/(13 μm or less) (e.g., 12 μm/12 μm, 10 μm/10 μm, 5 μm/5 μm, 2 μm/2 μm), it is desired to use an extremely thin copper foil having a thickness smaller than ever before (for example, 1 μm or less). Such an extremely thin copper foil manufactured by an electrolytic deposition technique, however, is likely to have problems, such as pinhole formation due to the excessively small thickness. Another disclosed technique for manufacturing an extremely thin copper foil having a thickness of 3 μm or less involves sputtering instead of the conventional electrolytic deposition. The resulting extremely thin copper foil, however, is not expected to have the anchoring effect based on asperities on the copper foil surface because of its extremely smooth surface (e.g., arithmetic average roughness Ra: 200 nm or less). Thus, it has been difficult to ensure the high bonding strength between such an extremely thin copper foil and the resin layer. In this regard, the surface-treated copper foil according to the present invention can have the improved adhesion to the resin layer by a chemical technique controlling the composition of the surface coating layer instead of a physical technique such as the anchoring effect for the conventional extremely thin copper foil. Thus, a surface coating layer which is mainly composed of silicon and has a hydrogen content of 1 to 35 atomic % and/or a carbon content of 1 to 15 atomic % formed on at least one surface of the copper foil provides a copper foil composite provided with a surface coating layer that can achieve a high bonding strength to a resin layer even if the copper foil has an extremely smooth surface such as one formed by vapor deposition, for example, as sputtering. Furthermore, the surface coating layer having the above composition can achieve a desirable insulation resistance suitable for a fine pitch in a printed wiring board to prevent or reduce the leakage current among interconnections in the fine-pitched wiring pattern.

Accordingly, the surface-treated copper foil of the present invention is preferably used for manufacturing a copper-clad laminate for a printed wiring board, wherein the manufacturing involves laminating a resin layer (typically, insulating resin layer) on the surface coating layer.

The copper foil constituting the surface-treated copper foil according to the present invention may be manufactured in any manner. In other words, the copper foil may be an electrodeposited copper foil or a rolled copper foil. Alternatively, in the case where the copper foil is provided with a carrier, the copper foil may be formed by a wet process, for example, electroless-copper plating or electro-copper plating; physical vapor deposition, for example, sputtering or vacuum vapor deposition; chemical vapor deposition; or combination thereof. Particularly preferred is a copper foil manufactured by physical vapor deposition, for example, sputtering or vacuum vapor deposition because the resulting copper foil is extremely thin (e.g., 3 μm or less) and is suitable to meet a fine pitch. The most preferred is a copper foil manufactured by sputtering deposition. The copper foil is preferably not roughened, but may be preliminary roughened or secondarily roughened by, soft etching, cleaning, or oxidation reduction if the wiring pattern can be formed without difficulty during the production of printed wiring boards. The copper foil may have any thickness. To meet the fine pitch described above, the thickness is in a range of preferably 50 to 3000 nm, more preferably 75 to 2000 nm, even more preferably 90 to 1500 nm, especially preferably 100 to 1000 nm, most preferably 100 to 700 nm. The copper foil having a thickness within such a range is preferably manufactured by sputtering deposition in view of uniformity of in-plane thickness of the foil and productivity in the form of a sheet or a roll.

The surface, on the side of the surface coating layer, of the copper foil constituting the surface-treated copper foil according to the present invention has an arithmetic average roughness Ra (measured according to JIS B 0601-2001) of preferably 200 nm or less, more preferably 1 to 180 nm, even more preferably 2 to 175 nm, especially preferably 3 to 130 nm, most preferably 5 to 100 nm. Such a surface-treated copper foil having a smaller arithmetic average roughness can form a highly miniaturized wiring pattern having such a fine line/space (L/S) of (13 μm or less)/(13 μm or less) (e.g., 12 μm/12 μm to 2 μm/2 μm) in the printed wiring board. Although such an extremely smooth copper foil surface is not expected to have the anchoring effect based on asperities on the copper foil surface, the surface-treated copper foil according to the present invention can achieve the improved adhesion to the resin layer by adopting a chemical technique controlling the composition of the surface coating layer instead of a physical technique such as the anchoring effect described above.

Figure 1A:
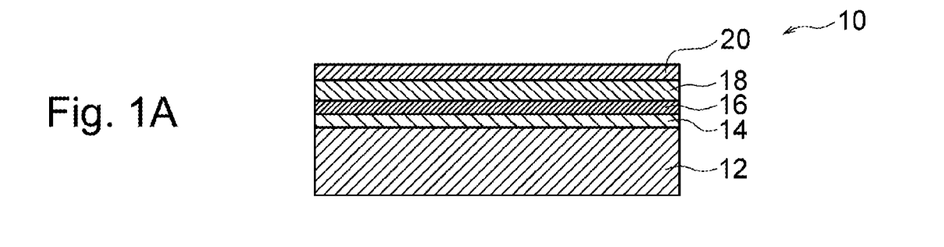
FIGS. 1A-1C are flow diagrams illustrating a process of manufacturing a copper foil provided with a carrier in Examples 1 to 15.

As described above, the surface-treated copper foil according to the present invention may be provided in the form of a copper foil provided with a carrier. The handling of the extremely thin copper foil can be improved when used in the form of a copper foil provided with a carrier. In particular, a copper foil can be manufactured by vacuum vapor deposition such as sputtering desirably by adopting the form of the copper foil provided with a carrier. As shown in FIG. 1(a), the copper foil 10 provided with a carrier may include a carrier 12, a release layer 16, an extremely thin copper foil layer 18, and a surface coating layer 20 in this order. A refractory metal layer 14 may be provided between the carrier 12 and the release layer 16. Furthermore, the copper foil 10 provided with a carrier may include these layers laminated symmetrically on the upper and lower surfaces of the carrier 12. The copper foil provided with a carrier can have any known layer configuration except that the extremely thin copper foil layer 18 and the surface coating layer 20 are provided. Examples of the carrier include a metal foil such as a copper foil, a nickel foil, a stainless steel foil, and an aluminum foil; a resin film such as a PET film, a PEN film, an aramid film, a polyimide film, a nylon film, and a liquid crystal polymer; and a metal coated resin film composed of a metal coating layer on a resin film, preferably a copper foil. The copper foil as a carrier may be either a rolled copper foil or an electrodeposited copper foil. The carrier has a thickness of typically 210 μm or less, preferably in the range of 10 to 210 μm in view of transportability of the copper foil provided with the carrier and tear resistance at the time of separation of the carrier. Preferred examples of the metal constituting the refractory metal layer 14 include iron, nickel, titanium, tantalum, and tungsten. Particularly preferred is titanium. These metals have a high stability as an interdiffusion barrier under hot pressing conditions, for example. In particular, titanium exhibits excellent high-temperature resistance because its oxide forms a very strong passivated film. In this case, the titanium layer is preferably formed by a physical vapor deposition such as sputtering. The refractory metal layer 14 such as a titanium layer has an equivalent thickness of preferably 1 to 50 nm, more preferably 4 to 50 nm. On the refractory metal layer 14 (particularly titanium layer) are provided preferably at least one of a carbon layer and a metal oxide layer, more preferably a carbon layer as the release layer 16. Since interdiffusion and reactivity between carbon and a carrier is low, carbon can prevent formation of metal bonding at the interface to the copper foil layer even during hot pressing at higher than 300° C. to ensure easy separation or removal of the carrier. The carbon layer is also preferably formed by a physical vapor deposition such as sputtering. It is preferred that the carbon layer have an equivalent thickness in the range of 1 to 20 nm. The term "equivalent thickness" indicates a thickness calculated by the chemically determined amount of the adhering component per unit area.

The surface coating layer constituting the surface-treated copper foil according to the present invention is a silicon-based surface coating layer mainly composed of silicon, having a hydrogen content of 1 to 35 atomic % and/or a carbon content of 1 to 15 atomic %. Silicon constituting the silicon-based surface coating layer is typically amorphous silicon. Although the silicon-based surface coating layer containing any one of hydrogen and carbon in the amount described above is considered to be able to achieve adhesion to the resin layer and insulation resistance at the same time, it is preferred that the silicon-based surface coating layer have both of a hydrogen content of 1 to 35 atomic % and a carbon content of 1 to 15 atomic %. Furthermore, a silicon-based material constituting the surface coating layer may contain incidental impurities introduced from raw material components or during film-forming process. For example, addition of a small amount of a conductive dopant such as boron to a DC sputtering target may involves mixing of a trace amount of such a dopant into the surface coating layer. Such incidental impurities contamination can be tolerated. Furthermore, the silicon-based surface coating layer may contain other dopants within the scope not departing from the gist of the present invention. The presence of oxygen introduced by exposure to the atmosphere after the silicon film formation can be also tolerated.

The silicon-based surface coating layer has a silicon content of preferably 50 to 98 atomic %, more preferably 55 to 95 atomic %, still more preferably 65 to 90 atomic %. The content within such a range can significantly enhance electrical insulation and heat resistance of the amorphous silicon. The content of the silicon element is measured with a high frequency glow discharge light emitting surface analyzer (glow discharge spectroscopy: GDS).

The silicon-based surface coating layer has a hydrogen content in the range of preferably 1 to 35 atomic %, more preferably 10 to 31 atomic %, still more preferably 15 to 30 atomic %, particularly preferably 20 to 30 atomic %, most preferably 22 to 26 atomic %. The silicon-based surface coating layer has a carbon content in the range of preferably 1 to 15 atomic %, more preferably 3 to 13 atomic %, still more preferably 4 to 12 atomic %, particularly preferably 5 to 12 atomic %, most preferably 6 to 11 atomic %. The content of the carbon and/or hydrogen, preferably the contents of the carbon and hydrogen within such ranges can significantly enhance adhesion to the resin layer and insulation resistance.

The contents of hydrogen and the carbon in the silicon-based surface coating layer can be determined from the depth profiles measured by Rutherford backscattering spectroscopy (RBS), hydrogen forward scattering (HFS), or nuclear reaction analysis (NRA). Examples of instruments for such measurements include Pelletron 3SDH (available from National Electrostatics Corporation). The content can be measured on the silicon-based surface coating layer immediately after the coating layer is formed on the copper foil. Furthermore, in the form of printed wiring boards or electronic components manufactured with the surface-treated copper foil according to the present invention, which will be described later, the surface is polished until the wiring pattern from the surface-treated copper foil is exposed, and subsequently the wiring pattern is etched to expose the surface coating layer. The content described above can thereby be measured.

The surface coating layer has a thickness in the range of preferably 0.1 to 100 nm, more preferably 2 to 100 nm, still more preferably 2 to 20 nm, particularly preferably 4 to 10 nm. The thickness within such a range can significantly enhance the adhesion to the resin layer and also insulation resistance.

Method of Manufacture

The surface-treated copper foil according to the present invention can be manufactured as follows: The copper foil described above is prepared; a surface coating layer composed mainly of silicon and having a hydrogen content of 1 to 35 atomic % and/or a carbon content of 1 to 15 atomic % is formed on at least one surface of the copper foil by physical or chemical vapor deposition. As described above, surface coating layers may be formed on two surfaces of the copper foil, if desired.

The copper foil used in the present invention can be manufactured in any manner, as described above in more detail. Particularly preferred is a copper foil manufactured by physical vapor deposition, for example, sputtering because the resulting copper foil is extremely thin (e.g., 1 μm or less in thickness) and is suitable to meet a fine pitch. The most preferred is a copper foil manufactured by sputtering deposition. Such a copper foil is preferably prepared in the form of a copper foil provided with a carrier.

In the method of manufacture according to the present invention, the surface coating layer is formed by physical vapor deposition or chemical vapor deposition. The physical vapor deposition or the chemical vapor deposition can readily control the content of hydrogen and/or carbon and form an extremely thin film (0.1 to 100 nm) suitable for the surface coating layer. Thus, a silicon-based surface coating layer having a hydrogen content of 1 to 35 atomic % and/or a carbon content of 1 to 15 atomic % can be preferably manufactured.

The surface coating layer is preferably formed by physical vapor deposition. Examples of the physical vapor deposition include sputtering, vacuum deposition, and ion plating, most preferably sputtering. The sputtering can form an extremely thin surface coating layer in a significantly good state without impairing the smoothness (preferably having an arithmetic average roughness Ra of 200 nm or less). The structure such as copper foil 10 provided with a carrier as shown in FIG. 1(*a*) has an advantage of significantly improved efficiency of manufacturing because all of the refractory metal layer 14, the release layer 16, the extremely thin copper foil layer 18, and the surface coating layer 20 on a carrier 12 can be formed by sputtering.

It is preferred that the physical vapor deposition be carried out with at least one additive component containing a carbon source and a hydrogen source using a silicon target and/or silicon carbide target under a non-oxidizing atmosphere. In this case, it is preferred that the additive component include at least one gas selected from the group consisting of methane, ethane, propane, butane, acetylene, and tetraethoxysilane. These materials are advantageous because each of these can serve as both a carbon source and a hydrogen source.

The physical vapor deposition can be carried out under any known condition in any known physical vapor deposition system. For example, if sputtering is used, then any of various known sputtering techniques such as magnetron sputtering and bipolar sputtering can be used. Magnetron sputtering is preferred in view of high deposition rate and high productivity. Sputtering can be performed with a direct current (DC) supply or radio frequency (RF) supply. In the case of DC sputtering, a trace amount (e.g., 0.01 to 500 ppm) of conductive dopant is desirably added to a silicon target from the view point of improved film-forming efficiency. Examples of such conductive dopants include boron, aluminum, antimony, and phosphorus, most preferably boron in view of efficiency of the deposition rate, toxicity avoidance, and moisture resistance of sputtering deposition. Furthermore, the ultimate vacuum within the chamber before the start of sputtering is preferably less than $1\times10^{-4}$ Pa. The gas used for sputtering includes inert gas such as argon gas, preferably in combination with other gas(es) (preferably methane, ethane, propane, butane, acetylene, tetraethoxysilane, or any combination thereof) as raw material for the additive components. The most preferable gas is a combination of argon and methane. Argon gas can be supplied at any flow rate, which may be determined as appropriate according to dimensions of the sputtering camber and deposition conditions. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon gas depending on the structure and volume of the device, the exhaust capacity of the vacuum pump, and the rated capacity of power supply for the film deposition. The sputtering power (per unit area of the target) can be appropriately determined within the range of 0.05 to 10.0 $W/cm^2$ from the view point of, for example, the uniform thickness and productivity of the film.

Copper-Clad Laminate for a Printed Wiring Board

According to a preferred aspect of the present invention, there is provided a copper-clad laminate for a printed wiring board including the surface-treated copper foil according to the present invention and a resin layer in close contact with the surface coating layer. The surface-treated copper foil(s) can be provided on either one or two surfaces of the resin later.

The resin layer includes a resin, preferably an insulating resin. The resin layer is preferably a prepreg and/or a resin sheet. Prepreg is a general term for composite material which is formed such that a substrate, such as a synthetic resin plate, a glass plate, woven glass fabric, nonwoven glass fabric, and paper, is impregnated with a synthetic resin. Preferred examples of the insulating resin include epoxy resins, cyanate resins, bismaleimide triazine (BT) resins, poly(phenylene ether) resins, and phenolic resins. Examples of the insulating resin that constitutes the resin sheet include epoxy resins, polyimide resins, polyester resins, and poly (phenylene ether) resins. Furthermore, the resin layer can contain various inorganic fillers such as silica, talc, and alumina from the view point of enhanced insulating property. The resin layer has any thickness, for example, preferably 1 to 1000 μm, more preferably 2 to 400 μm, even more preferably 3 to 200 μm. Resin layer may be composed of a plurality of layers. For examples, one outer layer prepreg may be provided on each surface of the inner prepreg (two on both sides in total) to constitute a resin layer. In this case, the inner layer prepreg may also consist of two or more layers. The resin layer such as a prepreg and/or a resin sheet is preferably provided on the surface-treated copper foil through the primer resin layer applied in advance on the surface of the copper foil in view of the stable bonding strength and the surface scratch resistance of the copper foil.

Printed Wiring Board

The surface-treated copper foil according to the present invention is preferably used in the preparation of the printed wiring board. That is, according to the present invention, there is also provided a printed wiring board having a layer structure derived from the surface-treated copper foil. In this case, the printed wiring board includes a laminated layer structure including, in sequence, a resin layer, a layer composed mainly of silicon, having a hydrogen content of 1 to 35 atomic % and/or a carbon content of 1 to 15 atomic %, and a copper layer. The layer composed mainly of silicon is derived from the silicon-based surface coating layer of the surface-treated copper foil according to the present invention, and the copper layer is derived from the copper foil of the surface-treated copper foil according to the present invention. The resin layer is as described above with respect to the copper-clad laminate. In any case, the printed wiring board can have any known layer configuration, except for the surface-treated copper foil according to the present invention. Specific examples of the printed wiring board include a single-sided or double-sided printed wiring board formed in such a manner that the surface-treated copper foil according to the present invention is bonded to one or two surfaces of the prepreg and cured into a laminate (CCL) to form a circuit; and multi-layered printed wiring board that are composed of these printed wiring boards. Other specific examples include a flexible printed wiring board, a COF, and a TAB tape, which are formed in such a manner that the surface-treated copper foil according to the present invention is formed on the resin film to from a circuit. Still other specific examples include a build-up wiring board and a direct-buildup-on-wafer. The build-up wiring board is formed in a manner described below. The above-described resin layer is applied on the surface-treated copper foil according to the present invention to form a resin-coated copper foil (RCC), which is laminated to the above-described printed board using the resin layer as an insulating bonding layer to form a circuit using the surface-treated copper foil as a whole or a part of the wiring layer by a technique such as a modified semi-additive process (MSAP) or subtractive process. The direct-buildup-on-wafer is formed in such a manner that lamination of the resin-coated copper foil on a semiconductor integrated circuit and formation of the circuit are alternately repeated. More advanced specific examples include an antenna element formed in such a manner that the above-described resin-coated copper foil is laminated on a substrate to form a circuit; electronic material for a panel display or window glass formed in such a manner that the resin-coated copper foil is laminated on a glass sheet or a resin film through a bonding layer to form a circuit; and electromagnetic wave shielding film composed of the surface-treated copper foil according to the present invention coated with a conductive bonding agent.

EXAMPLES

The present invention will be described in further detail by the following examples.

Examples 1 to 15

(1) Preparation of a Copper Foil Provided with a Carrier

Figure 1B:
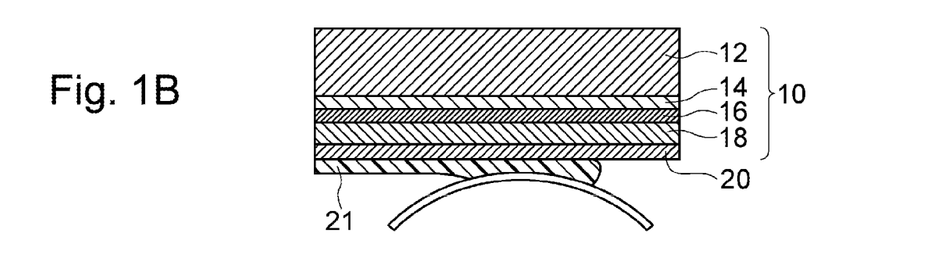
Figure 1C:
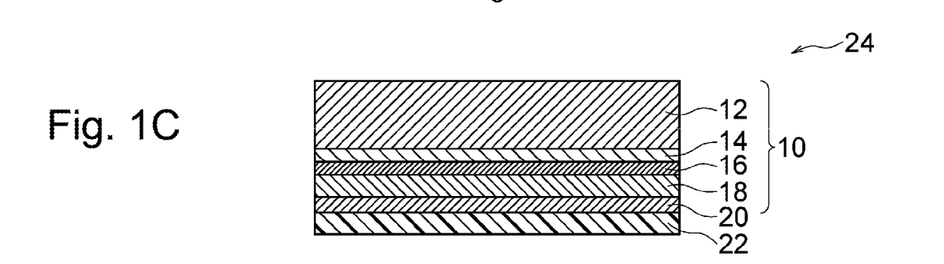

As shown in FIG. 1, a refractory metal layer 14, a release layer 16, an extremely thin copper foil layer 18, and a surface coating layer 20 were formed in this order on a carrier 12 of electrodeposited copper foil to prepare a copper foil 10 provided with a carrier, on which a primer resin layer 22 was formed, resulting in a copper foil 24 provided with a carrier. The surface coating layer 20 was formed according to the various conditions shown in Tables 1 and 2. The detailed procedures are as follows.

(1a) Preparation of Carrier

An electrodeposited copper foil with a thickness of 18 μm and a glossy surface having an arithmetic average roughness Ra of 60 to 70 nm (Mitsui Mining & Smelting Co.) was prepared as a carrier foil 12. The carrier was cleaned by pickling. The pickling was performed by immersing the carrier in a diluted sulfuric acid solution having a sulfuric acid concentration of 150 g/l at a temperature of 30° C. for 30 sec to remove the surface oxide layer, followed by rinsing with water and drying.

(1b) Formation of Refractory Metal Layer

A titanium refractory metal layer 14 having a 10 nm equivalent thickness was formed on the glossy surface of the pickled carrier 12 (electrodeposited copper foil) by sputtering under the following conditions:

Apparatus: Winding type DC sputtering system (manufactured by ULVAC, Inc., SPW-155)
Target: Titanium target having a size of 300 mm×1700 mm
Ultimate vacuum Pu: less than $1 \times 10^{-4}$ Pa
Sputtering pressure PAr: 0.1 Pa
Sputtering power: 30 kW (1c) Formation of Release Layer A release layer 16 of a carbon layer having a 2 nm equivalent thickness was formed on the refractory metal layer 14 (titanium layer) by sputtering under the following conditions:

Apparatus: Winding type DC sputtering system (manufactured by ULVAC, Inc., SPW-155)
Target: Carbon target having a size of 300 mm×1700 mm
Ultimate vacuum Pu: less than $1 \times 10^{-4}$ Pa
Sputtering pressure PAr: 0.4 Pa
Sputtering power: 20 kW (1d) Formation of Extremely Thin Copper Foil Layer An extremely thin copper foil layer 18 having a thickness of 250 nm was formed on the release layer 16 (carbon layer) by sputtering under the conditions described below. The resulting extremely thin copper foil layer had a surface with an arithmetic average roughness (Ra) of 46 nm.

Apparatus: Winding type DC sputtering system (manufactured by ULVAC, Inc., SPW-155)
Target: Copper target having a diameter of 8 inches (203.2 mm)
Ultimate vacuum Pu: less than $1 \times 10^{-4}$ Pa
Gas: Argon gas (flow rate: 100 sccm)
Sputtering pressure: 0.45 Pa
Sputtering power: 1.0 kW (3.1 W/cm²)

(1e) Formation of Surface Coating Layer

A silicon layer was formed as a surface coating layer 20 on the extremely thin copper foil layer 18 by sputtering under the conditions described below, resulting in a copper foil provided with a carrier.

Apparatus: Winding type DC sputtering system (manufactured by ULVAC, Inc., SPW-155)
Target: Silicon target having a diameter of 8 inches (203.2 mm) doped with 200 ppm boron
Ultimate vacuum Pu: less than $1 \times 10^{-4}$ Pa
Gas: Argon gas (flow rate: 100 sccm), methane gas (flow rate: 0 to 3.0 sccm)
Sputtering pressure: 0.45 Pa
Sputtering power: 250 W (0.8 W/cm²)

In Examples 1 to 8, as shown in Table 1, the contents of hydrogen and carbon in the silicon layer were varied by controlling the flow rate of methane gas in the gas under the condition of a constant thickness (6 nm) of the surface coating layer. In Examples 9 to 15, as shown in Table 2, the thickness of the silicon layer was varied in a range of 0 to 100 nm under the condition of a constant flow rate of methane gas (1.5 sccm). In all Examples, the surface coating layers were formed under the conditions described below.

The contents of hydrogen and carbon in the surface coating layer 20 (silicon layer) were measured. The measurement was carried out by Rutherford backscattering spectrometry (RBS), hydrogen forward scattering spectrometry (HFS), or nuclear reaction analysis (NRA) on Pelletron 3SDH (manufactured by National Electrostatics Corporation). Furthermore, the content of the silicon element in the surface coating layer 20 (silicon layer) was measured with a high frequency glow discharge light emitting surface analyzer (glow discharge spectroscopy: GDS). These results were as shown in Tables 1 and 2.

(1f) Formation of Primer Resin Layer

A sample having a primer resin layer on a surface coating layer and another sample having no primer layer were used for evaluation. The sample having a primer resin layer was prepared as follows. o-Cresol novolac epoxy resin (manufactured by Toto Chemical Industry Co., YDCN-704) and mixed varnish (manufactured by Nippon Kayaku Co., Ltd., BPAM-155) of a solvent-soluble aromatic polyamide resin polymer and a solvent were prepared as raw materials. A phenol resin (manufactured by DIC Corporation, VH-4170) as a curing agent and a curing accelerator (manufactured by Shikoku Chemical Corporation, 2E4MZ) were added to the mixed varnish to prepare a resin composition having the following mixing ratio:

Mixing Ratio of Resin Composition
o-Cresol novolak epoxy resin: 38 parts by weight
Aromatic polyamide resin polymer: 50 parts by weight
Phenolic resin: 18 parts by weight
Curing accelerator: 0.1 parts by weight Methyl ethyl ketone was added to the resin composition such that the resin solid content was 30% by weight to prepare a resin solution. As shown in FIG. 1, the resulting resin solution 21 was coated on the surface coating layer 20 (silicon layer) of the copper foil 10 with a carrier with a gravure coater. The coating was then dried in the air for 5 min and subsequently dried in a hot-air atmosphere at 140° C. for 3 min to form a semi-cured primer resin layer 22 having a thickness of 1.5 μm.

(2) Preparation of Copper-Clad Laminate

Figure 2A:
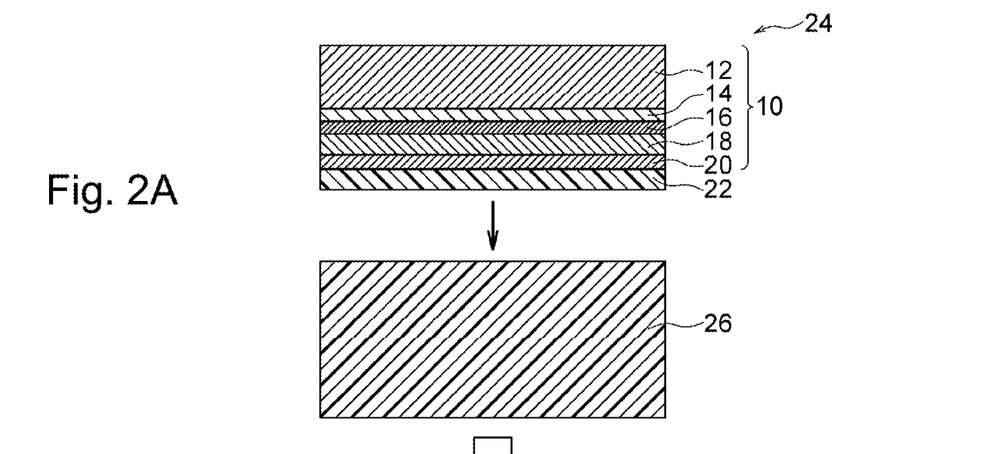
FIGS. 2A-2C are flow diagrams illustrating a process of manufacturing a copper-clad laminate in Examples 1 to 15.
Figure 2B:
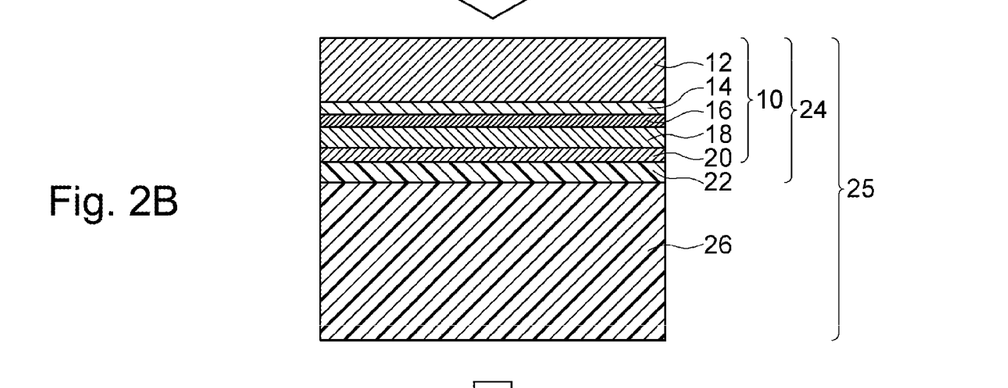
Figure 2C:
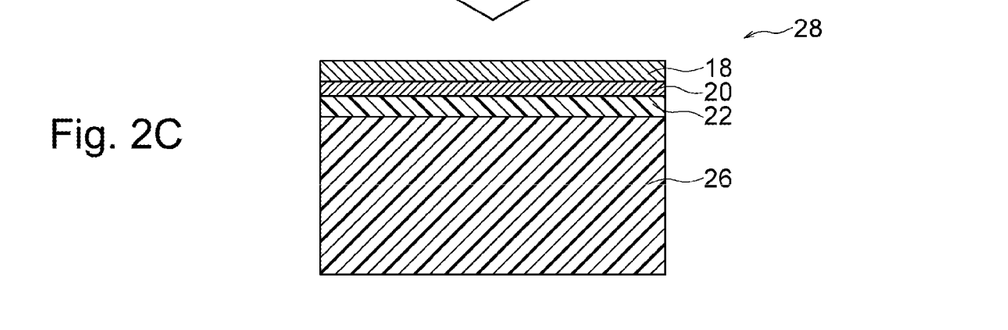

As shown in FIG. 2, a copper-clad laminate 28 was prepared from the copper foil 24 provided with a carrier and a resin substrate 26 as follows.

(2a) Preparation of Resin Substrate

Four prepreg sheets made of a bismaleimide triazine resin containing glass cloth (manufactured by Mitsubishi Gas Chemical Company Inc., GHPL-830NS, thickness: 45 μm) were laminated to prepare the resin substrate 26.

(2b) Lamination

The two sides of the resin substrate 26 were sandwiched by the copper foils 24 provided with carriers (in FIG. 2, only one side of the laminate is shown for simplicity) and the resin substrate 26 and the copper foils 24 provided with carriers are laminated under the conditions of a press temperature of 220° C., a press time of 90 min, and a pressure of 40 MPa, resulting in a copper-clad laminate 25 provided with a carrier.

(2c) Release of Carrier

The carrier 12 was released manually from the release layer 16 of the copper-clad laminate 25 provided with a carrier to expose the surface of the extremely thin copper foil layer 18. The refractory metal layer 14 and the release layer 16 were removed together with the carrier 12 (electrodeposited copper foil) when the carrier 12 was released, resulting in the copper-clad laminate 28.

(3) Evaluation

The resulting copper-clad laminate was subjected to (3a) evaluation of peel strength, (3c) evaluation of formed fine wiring pattern, and (3d) interfacial observation and element mapping analysis by STEM-EDS. Furthermore, an equivalent of the surface coating layer of the copper-clad laminate was prepared and subjected to (3b) evaluation of insulation resistance of the surface coating layer. The detailed procedures are as follows.

(3a) Evaluation of Peel Strength

Figure 3A:
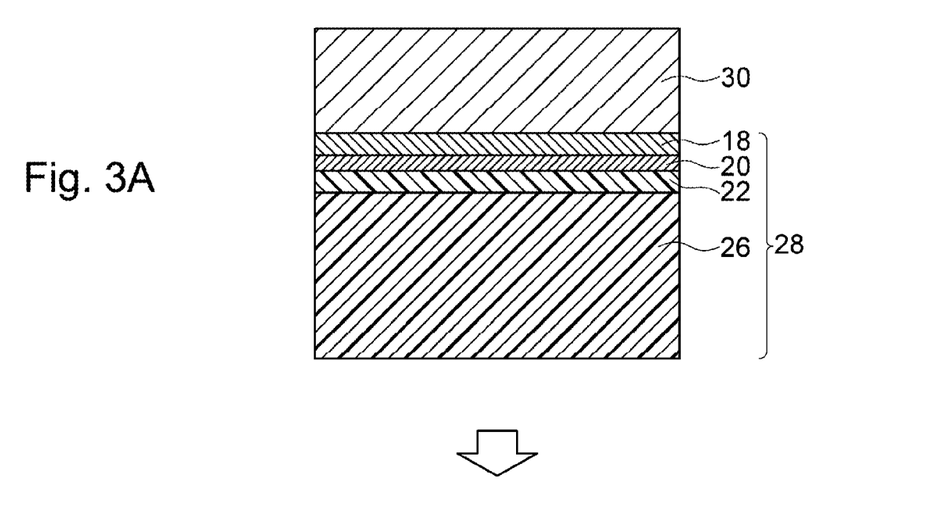
FIGS. 3A and 3B are flow diagrams illustrating a process of manufacturing a sample for measurement of peel strength in Examples 1 to 15.
Figure 3B:
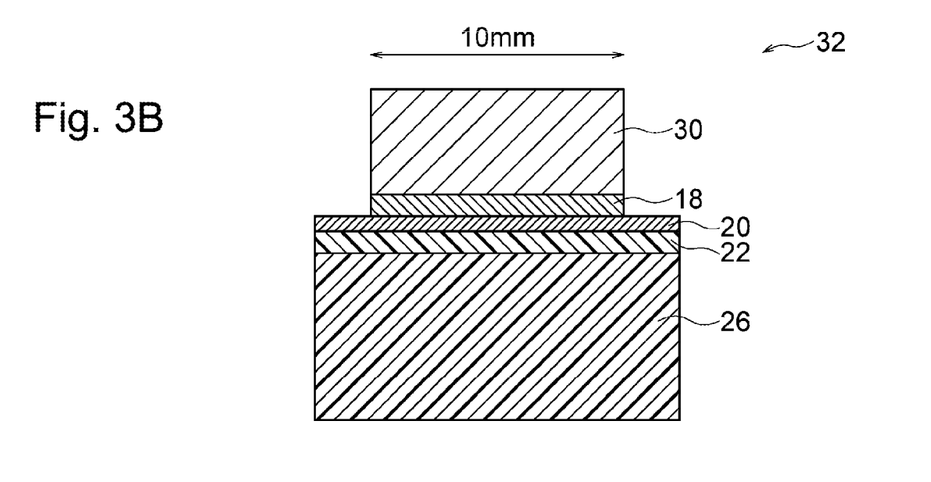

As shown in FIG. 3, a sample 32 was prepared with the copper-clad laminate 28 to evaluate the peel strength of the extremely thin copper foil 18 from the surface coating layer 20 and the primer resin layer 22. An electrolytic copper plating 30 having a thickness of 18 μm was formed on the copper-clad laminate 28 in a copper sulfate plating solution followed by pattern formation to prepare the sample 32 for measurement of peel strength. The pattern was formed as follows: the resulting electrodeposited copper plating was masked with a mask having a width of 10 mm and was etched with aqueous cupric chloride solution.

The peel strength was defined as the average peeling strength measured at three points under the conditions of an angle of 90 degrees and a rate of 50 mm/min. The resulting peel strength (average) was evaluated on the following three criteria A, B, and C. The results are shown in Tables 1 and 2.

Evaluation Criteria

A: 400 gf/cm or more
B: 300 gf/cm or more and less than 400 gf/cm
C: less than 300 gf/cm (3b) Evaluation of Insulation Resistance of Surface Coating Layer Samples of the surface coating layers corresponding to Examples 1 to 15 were prepared to evaluate insulation resistance. A surface coating layer (silicon layer) having 100 nm was formed on a glass substrate (manufactured by Corning Inc. #1737) under the same conditions as described in "(1e) Formation of surface coating layer" to prepare the samples for measurement of insulation resistance. The resulting samples were subjected to four-terminal sensing test using a semiconductor device analyzer (manufactured by Agilent Technologies, Inc., B1500A). The resulting specific resistance values ρ (Ω·cm) at the film thickness of 100 nm were converted into the values at 6 nm (ρ×100/6) (defined as sheet resistance (Ω/□)). The value of sheet resistance was used as an evaluation index of insulation resistance. The resulting sheet resistance values were evaluated on the following three criteria A, B, and C. The results are shown in Tables 1 and 2.

Evaluation Criteria

A: $1.0 \times 10^{12}$ Ω/□ or more
B: $1.0 \times 10^{10}$ Ω/□ or more and less than $1 \times 10^{12}$ Ω/□
C: less than $1.0 \times 10^{10}$ Ω/□

TABLE 1

| | | Ex. 1 (Comp.) | Ex. 2 | Ex. 3 | Ex. 4 | Ex. 5 | Ex. 6 | Ex. 7 | Ex. 8 (Comp.) |
|---|---|---|---|---|---|---|---|---|---|
| Surface coating layer (Si layer) | Flow rate of methane gas (sccm) | 0 | 0.1 | 0.5 | 1.0 | 1.5 | 2.0 | 2.5 | 3.0 |
| | Si content (at. %) | 98.7 | 94.6 | 86.7 | 70.7 | 64.2 | 56.3 | 51.0 | 45.3 |
| | Hydrogen content (at. %) | 0.8 | 4.3 | 10.1 | 22.4 | 25.6 | 30.7 | 34.0 | 37.4 |
| | Carbon content (at. %) | 0.5 | 1.1 | 3.2 | 6.9 | 10.2 | 13.0 | 15.0 | 17.3 |
| Thickness of surface coating layer (Si layer) (nm) | | | | | | 6 | | | |
| Peel Strength (gf/cm) and its rank | Copper foil/substrate laminate | 289 / C | 391 / B | 403 / A | 413 / A | 459 / A | 497 / A | 422 / A | 188 / C |
| | Primer coated copper foil/substrate laminate | — | 692 / A | 753 / A | 730 / A | 748 / A | 762 / A | 722 / A | — |
| Sheet resistance (Ω/□) and its evaluation | | $4.7 \times 10^9$ / C | $7.0 \times 10^{11}$ / B | $1.8 \times 10^{12}$ / A | $>2 \times 10^{12}$ / A | $>2 \times 10^{12}$ / A | $>2 \times 10^{12}$ / A | $>2 \times 10^{12}$ / A | $>2 \times 10^{12}$ / A |
| L/S = 2/2(μm) pattern formability | | D | C | B | B | A | A | B | D |

TABLE 2

|  |  | Ex. 9 (Comp.) | Ex. 10 | Ex. 11 | Ex. 12 (the same as Ex. 5) | Ex. 13 | Ex. 14 | Ex. 15 |
|---|---|---|---|---|---|---|---|---|
| Surface coating layer (Si layer) | Flow rate of methane gas (sccm) |  |  |  | 1.5 |  |  |  |
|  | Si content (at. %) |  |  |  | 64.2 |  |  |  |
|  | Hydrogen content (at. %) |  |  |  | 25.6 |  |  |  |
|  | Carbon content (at. %) |  |  |  | 10.2 |  |  |  |
| Thickness of surface coating layer (Si layer) (nm) |  | 0 | 2 | 4 | 6 | 10 | 20 | 100 |
| Peel Strength (gf/cm) and its rank | Copper foil/substrate laminate | 210 C | 323 B | 440 A | 459 A | 449 A | 460 A | — |
|  | Primer coated copper foil/substrate laminate | — | — | — | 748 A | — | — | — |
| Sheet resistance (Ω/□) and its evaluation |  | — | >2 × 10$^{12}$ A | >2 × 10$^{12}$ A | >2 × 10$^{12}$ A | 7.1 × 10$^{11}$ B | 3.5 × 10$^{11}$ B | 7.0 × 10$^{10}$ B |
| L/S = 2/2(μm) pattern formability |  | D | C | B | A | A | A | B |

(3c) Evaluation of Fine Wiring Pattern

As shown in FIG. 4, pattern formability was evaluated by forming a fine wiring pattern 38 on the copper-clad laminate 28 prepared in each Example. Samples for evaluation of fine wiring patterning were formed as follows.

(i) Photoresist Coating

Figure 4A:
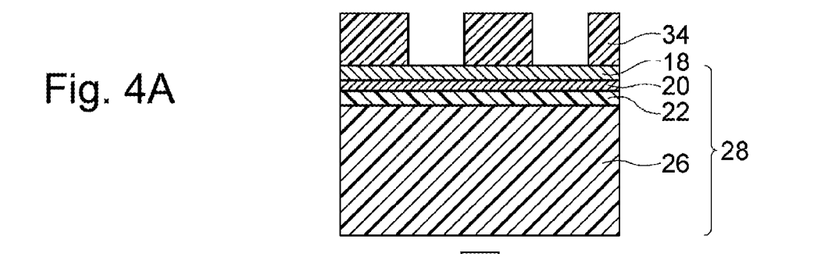
FIGS. 4A-4D are flow diagrams illustrating a process of forming a fine wiring pattern in Examples 1 to 15.
Figure 4B:
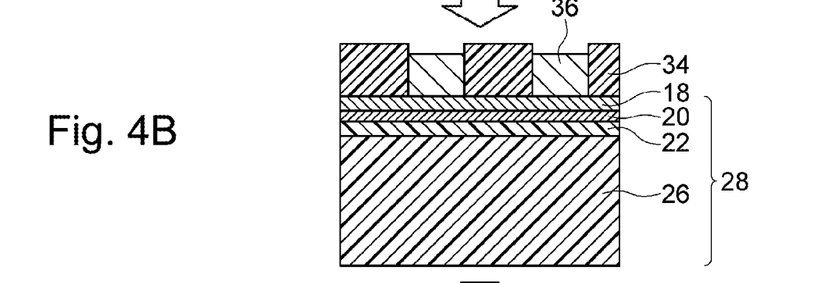
Figure 4C:
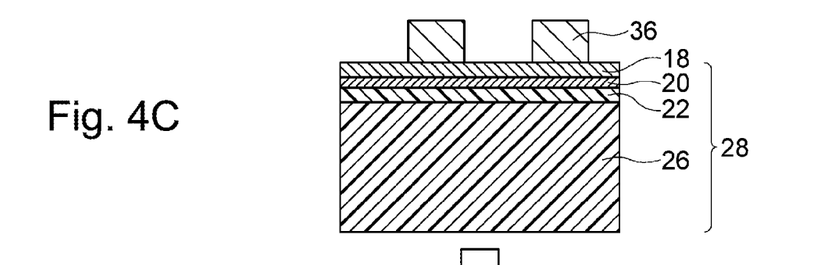
Figure 4D:
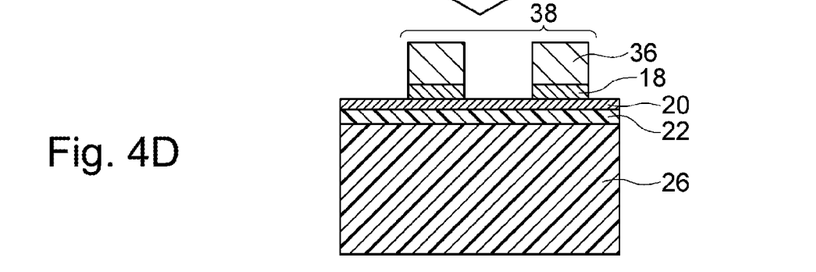

A positive photoresist (Tokyo Ohka Kogyo Co., Ltd., TMMRP-W1000T) was coated on an extremely thin copper foil layer 18 of the copper-clad laminate 28.

(ii) Exposure Treatment

The copper-clad laminate 28 coated with the photoresist was exposed under the conditions below.
Pattern: Line/Space=2 μm/2 μm, Length of pattern=2 mm
Glass mask: chromium evaporation mask
Exposure: 180 mJ/cm$^2$
(wavelength: 365 nm equivalent), mercury spectral line)

(iii) Development

The exposed copper-clad laminate 28 was developed under the conditions below to pattern the photoresist 34 as shown in FIG. 4(a).
Developer: aqueous TMAH solution (manufactured by Tokyo Ohka Kogyo Co., Ltd., NMD-3)
Temperature: 23° C.
Treatment: dip (1 min×2 times)

(iv) Electrolytic Copper Plating

An electrolytic copper plating 36 having a thickness of 2 μm was formed on the extremely thin copper foil layer 18 of the copper-clad laminate 28 having developed patterns using copper sulfate plating solution, as shown in FIG. 4 (b).

(v) Stripping of Photoresist

The photoresist 34 was stripped from the copper-clad laminate 28 having an electrolytic copper plating 36 under the following conditions into a state shown in FIG. 4 (c).
Stripping liquid: aqueous ST106 solution (manufactured by Tokyo Ohka Kogyo Co.)
Temperature: 60° C.
Time: 5 min (vi) Copper Etching (Flash Etching)

The copper-clad laminate 28 after stripping of the photoresist 34 was subjected to copper etching under the following conditions to form a fine wiring pattern 38 shown in FIG. 4 (d).
Etching solution: a mixture of sulfuric acid and hydrogen peroxide (manufactured by MEC Co., Ltd., QE7300)
Treatment: dip
Temperature: 30° C.
Time: 30 sec (vii) Microscopic Observation The appearance of the resulting fine wiring pattern was observed with an optical microscope (1750 magnifications) to evaluate the wiring defects due to peeling. The rate of defects is evaluated in accordance with the following criteria.

Evaluation Criteria
A: Rate of defects: less than 5% (best)
B: Rate of defects: 6% to 10% (good)
C: Rate of defects 11% to 20% (tolerable)
D: Rate of defects 21% or more (poor)

Figure 5:
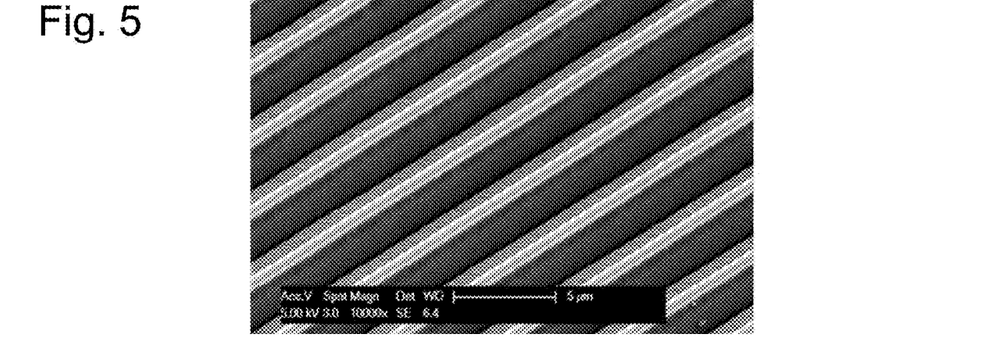
FIG. 5 is a SEM photograph of the fine wiring pattern observed in Example 5.

The results of the evaluation are shown in Tables 1 and 2. The SEM photograph of the fine wiring pattern observed in Example 5 (Present Invention) is shown in FIG. 5.

(3d) Interfacial Observation and Element Mapping Analysis by STEM-EDS

Figure 6A:
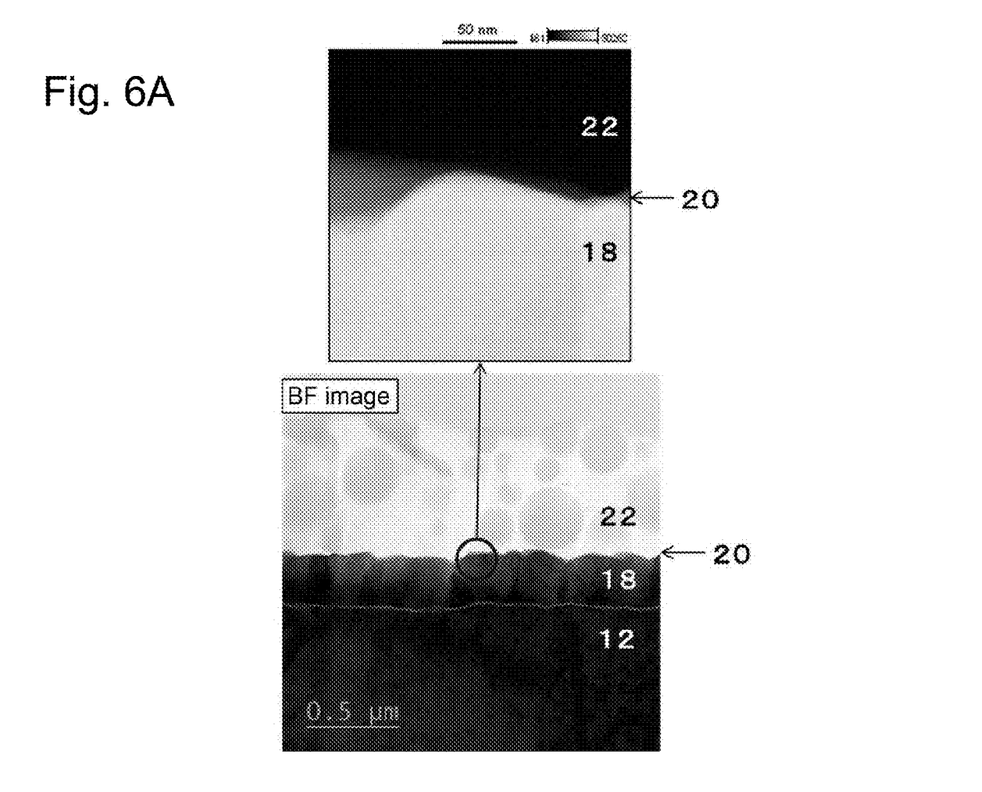
FIG. 6A is a STEM-EDS image of interfaces defined by an extremely thin copper foil layer 18, a surface coating layer 20, and a primer resin layer 20 in the copper-clad laminate prepared in Example 5.
Figure 6B:
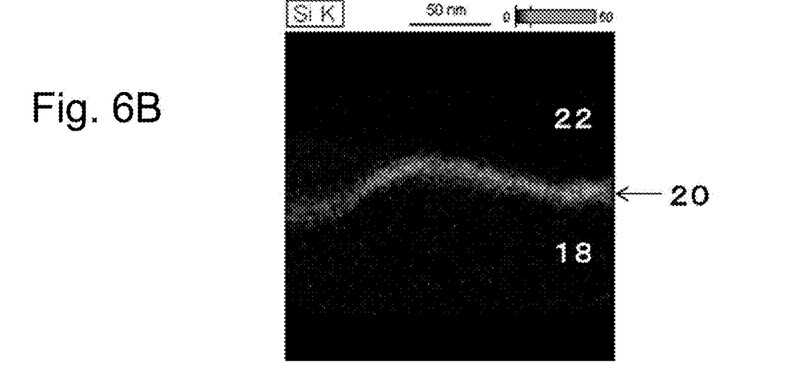
FIG. 6B is a mapping image of the Si element at interface portions shown by the enlarged image in FIG. 6A.
Figure 6C:
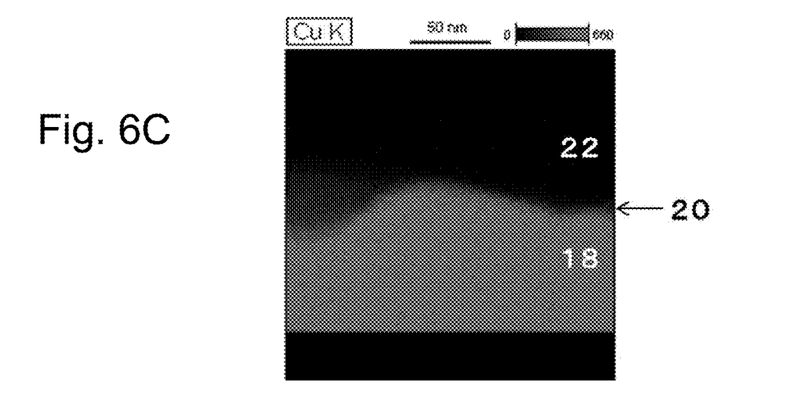
FIG. 6C is a mapping image of the Cu element at interface portions shown by the enlarged image in FIG. 6A.

STEM-EDS images of interfaces defined by a carrier 12, an extremely thin copper foil layer 18, a surface coating layer 20, and a primer resin layer 22 in a copper-clad laminate 25 provided with a carrier coated on the primer resin layer 22 prepared in Example 5 (Present Invention) are shown in FIG. 6A. The upper image in FIG. 6A is an enlarged image corresponding to the interface portion surrounded by a circle in the lower photographic image. The mapping images of Si and Cu elements of the interface portion in the enlarged image are shown in FIGS. 6B and 6C, respectively. As is apparent from the comparison of these images, the silicon-based surface coating layer 20 is formed on the surface of the extremely thin copper foil layer 18.

The invention claimed is:

1. A surface-treated copper foil comprising:
a copper foil; and
a surface coating layer provided on at least one surface of the copper foil, the surface coating layer consists of amorphous silicon, hydrogen, carbon, and incidental impurities, and has an amorphous silicon content of 70.7 to 90 atomic %, a hydrogen content of 1 to 35 atomic %, and a carbon content of 1 to 15 atomic %, wherein the surface coating layer has a thickness of 0.1 to 100 nm.

2. The surface-treated copper foil according to claim 1, for use in manufacturing of a copper-clad laminate for a printed wiring board, wherein the manufacturing involves laminating a resin layer on the surface coating layer.

3. The surface-treated copper foil according to claim 1, wherein the surface, on a side of the surface coating layer, of the copper foil has an arithmetic average roughness Ra of 100 nm or less measured in accordance with JIS B 0601-2001.

4. The surface-treated copper foil according to claim 1, wherein the surface coating layer has a hydrogen content of 10 to 30 atomic %.

5. The surface-treated copper foil according to claim 1, wherein the surface coating layer has a carbon content of 3 to 13 atomic %.

6. The surface-treated copper foil according to claim 1, wherein the copper foil has a thickness of 50 to 1000 nm.

7. A copper-clad laminate for a printed wiring board comprising the surface-treated copper foil according to claim 1 and a resin layer in close contact with the surface coating layer.

8. A method of manufacturing a printed wiring board, wherein the printed wiring board is manufactured using the surface-treated copper foil according to claim 1.

9. A method for manufacturing a surface-treated copper foil according to claim 1, comprising the steps of:
providing a copper foil; and
forming a surface coating layer having a thickness of 0.1 to 100 nm on at least one surface of the copper foil by physical vapor deposition or chemical vapor deposition, the surface coating layer consisting of amorphous silicon, hydrogen, carbon, and incidental impurities, and has an amorphous silicon content of 70.7 to 90 atomic %, a hydrogen content of 1 to 35 atomic %, and a carbon content of 1 to 15 atomic %.

10. The method according to claim 9, wherein the surface coating layer is formed by physical vapor deposition wherein the physical vapor deposition is performed by sputtering.

11. The method according to claim 9, wherein the physical vapor deposition is performed with at least one additive component containing a carbon source and a hydrogen source using a silicon target and/or silicon carbide target under a non-oxidizing atmosphere.

12. The method according to claim 11, wherein the additive component comprises at least one gas selected from the group consisting of methane, ethane, propane, butane, acetylene, and tetraethoxysilane.

\* \* \* \* \*